(12) United States Patent
Huang et al.

(10) Patent No.: US 9,679,803 B2
(45) Date of Patent: Jun. 13, 2017

(54) METHOD FOR FORMING DIFFERENT PATTERNS IN A SEMICONDUCTOR STRUCTURE USING A SINGLE MASK

(71) Applicant: Taiwan Semiconductor Manufacturing Company, Ltd., Hsin-Chu (TW)

(72) Inventors: Tsung-Min Huang, Taichung (TW); Chung-Ju Lee, Hsinchu (TW); Chih-Tsung Shih, Hsinchu (TW); Yen-Cheng Lu, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 334 days.

(21) Appl. No.: 14/153,875

(22) Filed: Jan. 13, 2014

(65) Prior Publication Data

US 2015/0200130 A1    Jul. 16, 2015

(51) Int. Cl.
*H01L 21/47* (2006.01)
*H01L 21/76* (2006.01)
*H01L 21/30* (2006.01)
*H01L 21/46* (2006.01)
*H01L 21/768* (2006.01)
(Continued)

(52) U.S. Cl.
CPC ...... *H01L 21/76811* (2013.01); *G03F 7/0035* (2013.01); *G03F 7/094* (2013.01); *H01L 21/0274* (2013.01); *H01L 21/31144* (2013.01); *H01L 21/76808* (2013.01); *H01L 21/76813* (2013.01)

(58) Field of Classification Search
CPC .......... H01L 21/76802; H01L 21/0274; H01L 21/31144; H01L 21/76877; H01L 21/76; G03F 7/094; G03F 7/0035; G03F 9/00
USPC .......... 438/618, 708, 685, 640, 735
See application file for complete search history.

(56) References Cited

U.S. PATENT DOCUMENTS 5,407,785 A * 4/1995 Leroux .............. G03F 1/28
430/312
6,245,492 B1 * 6/2001 Huang .............. G03F 7/2022
430/326

(Continued)

FOREIGN PATENT DOCUMENTS

| TW | 437040 | 5/2001 |
| TW | 200715039 | 4/2007 |
| TW | I422961 | 1/2014 |

*Primary Examiner* — Jessica Manno
*Assistant Examiner* — Sheikh Maruf
(74) *Attorney, Agent, or Firm* — Haynes and Boone, LLP

(57) ABSTRACT

The present disclosure provides a method for forming an integrated circuit (IC) structure. The method comprises providing a semiconductor structure including a substrate, a dielectric layer formed over the substrate, and a hard mask region formed over the dielectric layer; forming a first photoresist layer over the hard mask region; performing a first lithography exposure using a photomask to form a first latent pattern; forming a second photoresist layer over the hard mask region; and performing a second lithography exposure using the photomask to form a second latent pattern. The photomask includes a first mask feature and a second mask feature. The first latent pattern corresponds to the first mask feature, and the second latent pattern corresponds to the first mask feature and the second mask feature.

20 Claims, 12 Drawing Sheets

(51) Int. Cl.
*G03F 7/00* (2006.01)
*G03F 7/09* (2006.01)
*H01L 21/027* (2006.01)
*H01L 21/311* (2006.01)

(56) References Cited

U.S. PATENT DOCUMENTS

| | | | | |
|---|---|---|---|---|
| 7,022,452 B2* | 4/2006 | Lu | G03F 7/38 | 430/156 |
| 8,791,024 B1* | 7/2014 | Lu | H01L 21/0274 | 257/E21.492 |
| 2006/0014348 A1* | 1/2006 | Wu | H01L 27/11253 | 438/262 |
| 2006/0160028 A1* | 7/2006 | Lee | G03F 7/0035 | 430/312 |
| 2007/0178665 A1* | 8/2007 | West | G03F 1/144 | 438/427 |
| 2008/0145796 A1* | 6/2008 | Chen | G03F 7/0035 | 430/322 |
| 2008/0186468 A1* | 8/2008 | Hansen | G03F 7/70091 | 355/67 |
| 2008/0251877 A1* | 10/2008 | Jain | H01L 21/0272 | 257/499 |
| 2009/0011370 A1* | 1/2009 | Nakamura | G03F 7/0035 | 430/322 |
| 2009/0239375 A1* | 9/2009 | Riess | H01L 21/76808 | 438/640 |
| 2009/0253080 A1* | 10/2009 | Dammel | G03F 7/40 | 430/324 |
| 2010/0075238 A1* | 3/2010 | Fonseca | G03B 27/54 | 430/30 |
| 2010/0119960 A1* | 5/2010 | Fonseca | G03F 7/095 | 430/30 |
| 2010/0297851 A1* | 11/2010 | Bae | G03F 7/0035 | 438/735 |
| 2011/0003253 A1* | 1/2011 | Miyamoto | G03F 7/0035 | 430/312 |
| 2013/0157462 A1* | 6/2013 | Lee | H01L 21/0337 | 438/685 |
| 2014/0239501 A1* | 8/2014 | Tsai | H01L 21/76877 | 257/751 |

* cited by examiner

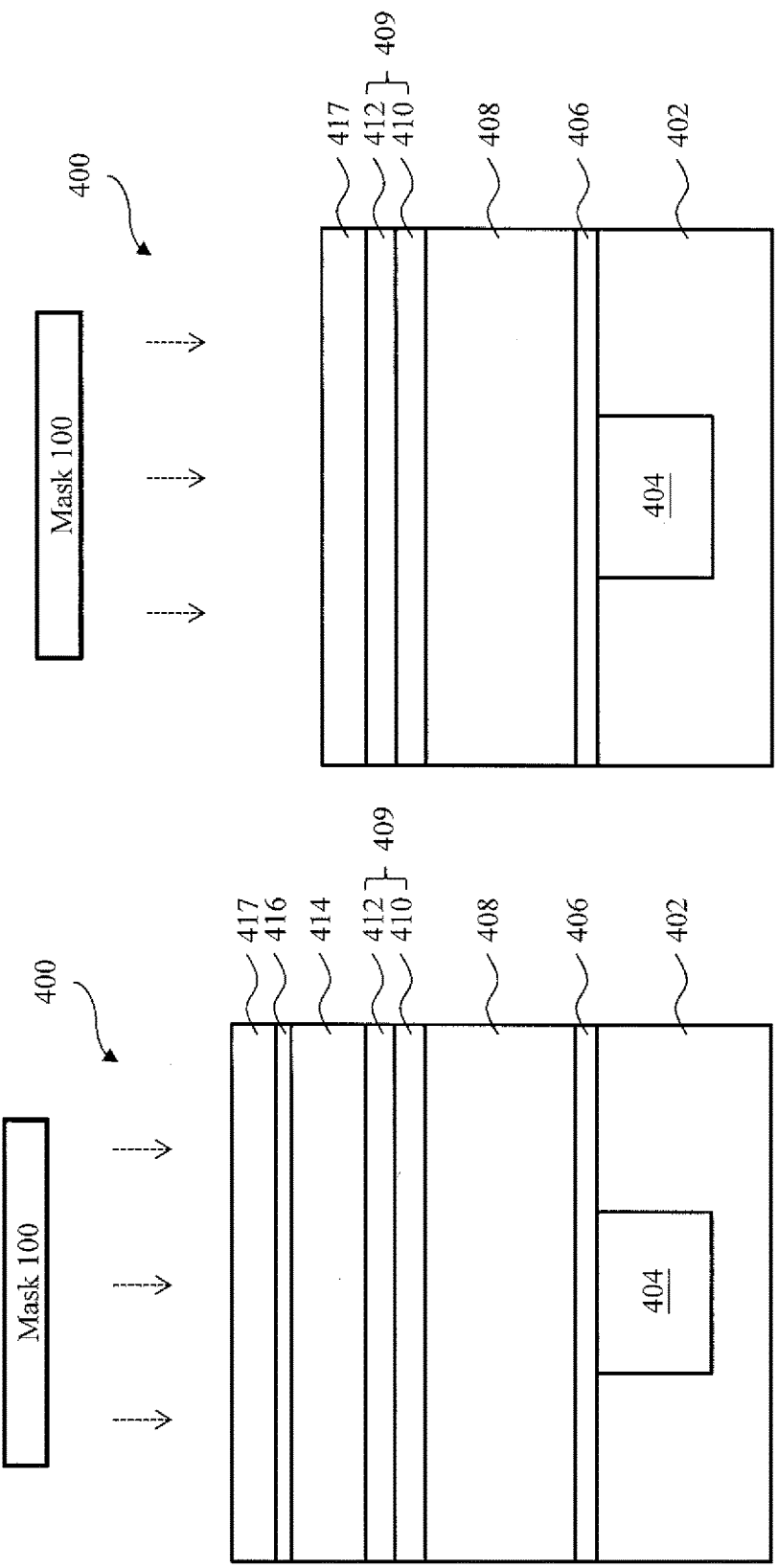

METHOD FOR FORMING DIFFERENT PATTERNS IN A SEMICONDUCTOR STRUCTURE USING A SINGLE MASK

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

ICs are commonly formed by a sequence of material layers, some of which are patterned by a photolithography process. It is important that the patterned layers properly align or overlay with adjacent layers. Proper alignment and overlay becomes more difficult in light of the decreasing geometry sizes of modern ICs. In addition, the surface topography of an underlying substrate, such as a semiconductor wafer, impacts the lithography imaging quality and further degrades the overlay tolerance between adjacent material layers. Furthermore, lithography processes are a significant contributor to the overall cost of manufacturing, including processing time and the cost of masks (also referred to as photomasks) used in the process. Therefore, what is needed is a lithography method to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4-12 are cross sectional views of a semiconductor structure at various fabrication stages constructed using the photomask of FIG. 1 according to one or more embodiments of the present disclosure.

FIGS. 4A, 5A, 7A, and 8A are cross sectional views of a semiconductor structure using more than one polymer layer during the lithography patterning process according to one or more embodiments of the present disclosure.

FIGS. 4B, 5B, 7B, and 8B are cross sectional views of a semiconductor structure using a single photoresist layer during the lithography patterning process according to one or more embodiments of the present disclosure.

DETAILED DESCRIPTION

Figure 1:
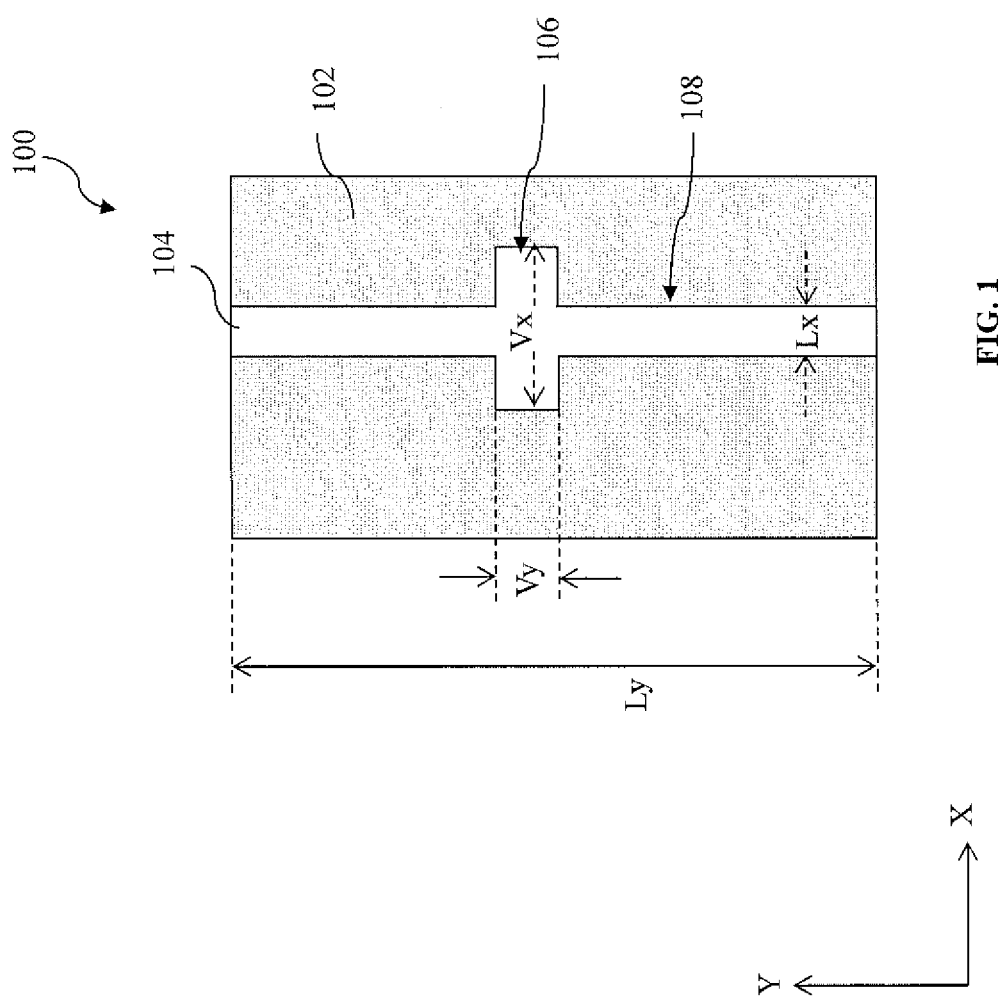
FIG. 1 is a top view of a photomask (also referred to as mask or reticle) having an integrated circuit (IC) design pattern according to some embodiments of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a top view of a photomask (also referred to as mask or reticle) 100 having an integrated circuit (IC) design pattern 104 according to some embodiments of the present disclosure. In some embodiments, the IC design pattern 104 may be used for forming more than one kind of feature (e.g., metal line and via features) using a lithography process. The photomask 100 includes a photomask substrate 102 and an IC design pattern 104. It is to be understood that the photomask 100 and the included IC design pattern 104 may in fact be part of a larger and more complicated photomask (not shown). The photomask 100 may be used to pattern one or more layers during the lithography patterning process.

The photomask 100 includes a photomask substrate 102 and the IC design pattern 104 formed thereon. In some embodiments, when the lithography technique, such as ultraviolet (UV) or deep ultraviolet (DUV), is used for patterning features on the wafer, the photomask substrate 102 includes a transparent substrate, such as fused quartz. An IC design pattern 104 is formed on the photomask substrate 102 and is defined in an opaque material layer, such as chromium (Cr).

In some alternative embodiments, when extreme ultraviolet (EUV) lithography technology is used, the photomask 100 is a reflective photomask including a photomask substrate 102 of a low thermal expansion material (LTEM). A reflective multilayer (ML) is deposited on the substrate 102, and an absorber layer is deposited over the reflective ML and is further patterned to define the IC pattern. It is to be understood that other configurations and inclusion or omission of various items may be possible. For example, a capping layer may be formed between the reflective ML and absorber layer. In another example, a protection layer may be formed on the absorber layer. In yet some alternative embodiments, the photomask 100 may be a phase shift mask (PSM), such as attenuating PSM or alternating PSM, for enhanced imaging resolution.

Referring to FIG. 1, in some embodiments, the IC design pattern 104 is a combined feature including a first feature 106 and a second feature 108. The first feature 106 is a feature oriented in the first direction (e.g., X direction) and the second feature 108 is a line feature oriented in the second direction (e.g., Y direction). In the present embodiment, the first direction (e.g., X direction) is perpendicular to and intersecting with the second direction (e.g., Y direction). The first feature 106 may be designed to form a first IC feature (e.g., via feature) in a material layer on the wafer, and the second feature 108 may be designed to form a second IC feature (e.g., metal line feature) in the same material layer or in a different material layer on the wafer. In the present embodiments, the first IC feature 106 is designed to form a via feature to connect and electrically coupled the metal line to another metal line in a layer below the via. The second IC feature 108 is designed to form a metal line in the semiconductor structure. Alternatively, the first IC feature 106 is designed to form a contact feature to connect and electrically couple the metal line to a gate electrode or a doped semiconductor feature (such as source or drain) in the semiconductor structure. The first feature 106 and second feature 108 may be formed on two photoresist layers using a single photomask 100 as shown in FIG. 1 using a lithography exposure process, such as ultraviolet (UV), deep ultraviolet (DUV) or extreme ultraviolet (EUV) lithography technique.

As shown in FIG. 1, the first feature 106 extends with a dimension Vx in the X direction and with a dimension Vy in the Y direction. The second feature 108 extends with dimensions Lx in the X direction and Ly in the Y direction. In some embodiments, the dimension Vx of the first feature 106 is greater than the dimension Lx of the second feature 108. The dimension Vy of the first feature 106 is less than the dimension Ly of the second feature 108. In furtherance of the embodiment, the first feature 106 and the second feature 108 are aligned to be co-centered in the X direction.

Alternatively, the IC design pattern may be defined in a lithography patterning data file and be transferred to material (e.g., photoresist) layers by other exposing systems, such as a charged particle beam (including electron-beam), in a suitable mode (such as direct writing in raster mode or vector mode, or using a digital pattern generator). In electron-beam lithography, the photoresist layers are often referred to as electron-beam sensitive resist layers.

Each photoresist material has its respective exposure threshold to radiation (for example an exposing beam of an EUV system). When the exposing intensity (also referred to as exposing dosage) is equal to or greater than the exposure threshold, the corresponding portion of the photoresist is chemically changed such that it will be developed (e.g., it is removed by the developer when the photoresist is positive tone) in a developing process. When the exposing intensity is less than the exposure threshold, the corresponding portion of the photoresist is not chemically changed to be developed (e.g., it remains during the developing process when the photoresist is positive tone). It is understood that the term "changed" means that the photoresist has sufficiently changed to respond differently, e.g., as exposed positive-tone photoresist responds in the development process. In one example where the photoresist is positive tone, only portions of the photoresist exposed with exposing intensity equal to or greater than the exposure threshold are removed by a suitable developer during the developing process. Other portions of the photoresist unexposed or exposed with exposing intensity less than the exposure threshold remain after the developing process. In another example where the photoresist is negative tone, the portions of the photoresist unexposed or exposed with exposing intensity less than the exposure threshold are removed by a suitable developer during the developing process. Other portions of the photoresist exposed with exposing intensity equal to or greater than the exposure threshold remain after the developing process.

Figure 2A:
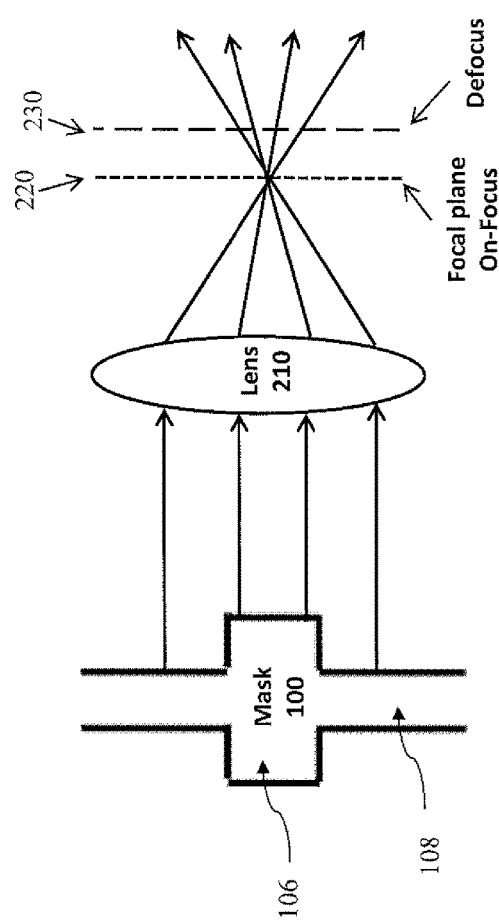
FIG. 2A is a schematic drawing illustrating the on-focus and defocus lithography exposures using the photomask of FIG. 1 according to some embodiments of the present disclosure.

FIG. 2A is a schematic drawing illustrating the on-focus and defocus lithography exposure processes using the photomask 100 of FIG. 1 according to some embodiments of the present disclosure. As shown in FIG. 2A, during an exposure process, the light passing through the mask 100 can be directed by the lens 210 to be focused on a focal plane 220. The semiconductor structure includes a photoresist layer deposited on the top, and it is sensitive to the exposure light. In the present embodiment, the photoresist layer is positive tone. After the exposure process, the photomask pattern can be transferred to the photoresist layer by forming latent patterns in the photoresist layer. In some embodiments, the photoresist layer is positioned on the focal plane 220 to receive maximized exposing intensity during the lithography exposure process. In some alternative embodiments, the photoresist layer is positioned behind the focal plane, e.g. at a defocus position 230. The exposing intensity received at the defocus position 230 is less than the exposing intensity received at the focal plane 220.

Figure 2C:
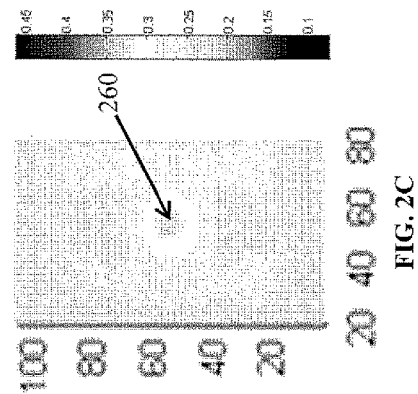
FIGS. 2B-2C are diagrammatical views of various exposing intensity profiles during lithography exposure processes using the photomask 100 of FIG. 1 according to some embodiments of the present disclosure.
Figure 2B:
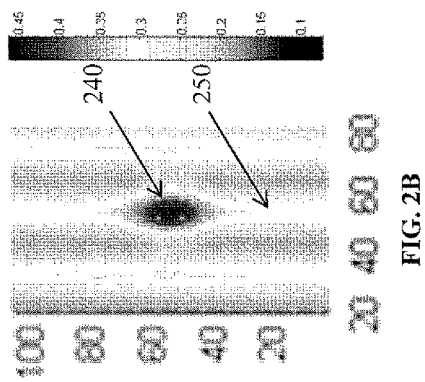

FIGS. 2B-2C are diagrammatical views of various exposing intensity profiles during a lithography exposure process using the photomask 100 of FIG. 1 according to some embodiments of the present disclosure. In some embodiments, the photomask 100 includes a via feature 106 with a greater dimension along the X direction (Vx), and a metal line feature 108 with a narrower dimension Lx along the X direction (Lx), as shown in FIG. 1. In some embodiments, the photoresist layer has an exposure threshold that is dependent on the composition of the photoresist layer. During the lithography exposure process with the IC patterns defined in the photomask 100, latent patterns are formed on the photoresist layer. The latent pattern of a photoresist layer refers to the exposed pattern on the photoresist layer, which eventually becomes a physical photoresist pattern, such as by a developing process. In the present case, the latent patterns illustrated in FIGS. 2B-2C are corresponding images of the exposed portions with exposing intensity equal to or greater than the exposure threshold of the photoresist layer.

FIGS. 2B-2C also include an exposing intensity scale marked with various intensity levels represented by various grey scales. In the present example, the unit for the exposing intensity is a relative unit ranging from 0 to 1. In this case, "1" stands for 100% of the exposing intensity from the exposing system before reaching the photoresist layers.

Referring to FIG. 2B, in some embodiments, when the photoresist layer is at the focal plane 220, the exposing intensity passing through both the via feature 106 and the metal line feature 108 to arrive at the photoresist layer is equal to or greater than the exposure threshold of the photoresist layer. Therefore, the latent patterns formed in the photoresist layer includes both the via feature and the metal line feature as indicated as regions 240 and 250 with higher exposing intensity in FIG. 2B.

Referring to FIG. 2C, in some embodiments, when the photoresist layer is at a defocus position behind the focal plane 220, e.g. at defocus position 230, the exposing intensity passing through the photomask to arrive at the photoresist layer is less than the exposing intensity at the on-focus position 220. In some embodiments, because the dimension Vx of the via feature 106 is greater than the dimension Lx of the metal line feature 108, the exposing intensity corresponding to the via feature 106 is greater than the exposing intensity corresponding to the metal line feature 108. In some embodiments, the exposing intensity passing through the via feature 106 to arrive at defocus position 230 is equal to or greater than the exposure threshold of the photoresist layer, but the exposing intensity passing through the metal line feature 108 to arrive at the defocus position 230 is less than the exposure threshold of the photoresist layer. Therefore, the latent patterns formed in the photoresist layer includes only the via feature as indicated as region 260 in FIG. 2C.

In various embodiments, by properly choosing the exposure threshold through tuning the composition of the photoresist materials, adjusting position of the photoresist layer relative to the lens 210, adjusting various dimensions of the IC design patterns on the photomask 100, or a combination thereof, different patterns corresponding to various IC features can be formed using a single photomask 100 on the photoresist layer as illustrated in the present disclosure. The lithography method and the photomask discussed in the present disclosure may provide a lithography process with lower cost and better alignment result by using a single photomask.

In the present embodiment, the lithography exposure process uses photons, such UV, DUV or EUV, a photomask is used and the IC design patterns are defined in the photomask. In this case, only one photomask is used to form two different IC features in the semiconductor structure by adjusting the position of the photoresist layer relative to the lens. In an alternative embodiment, charged particles are used as radiation beam during the lithography exposure process. In this case, the IC design pattern may be defined in a data file and the sensitive resist material is chosen to be sensitive to the charged particles, such as e-beam. The method to form two IC features using one photomask and the semiconductor structure made thereby are further described below according to various embodiments.

Figure 3:
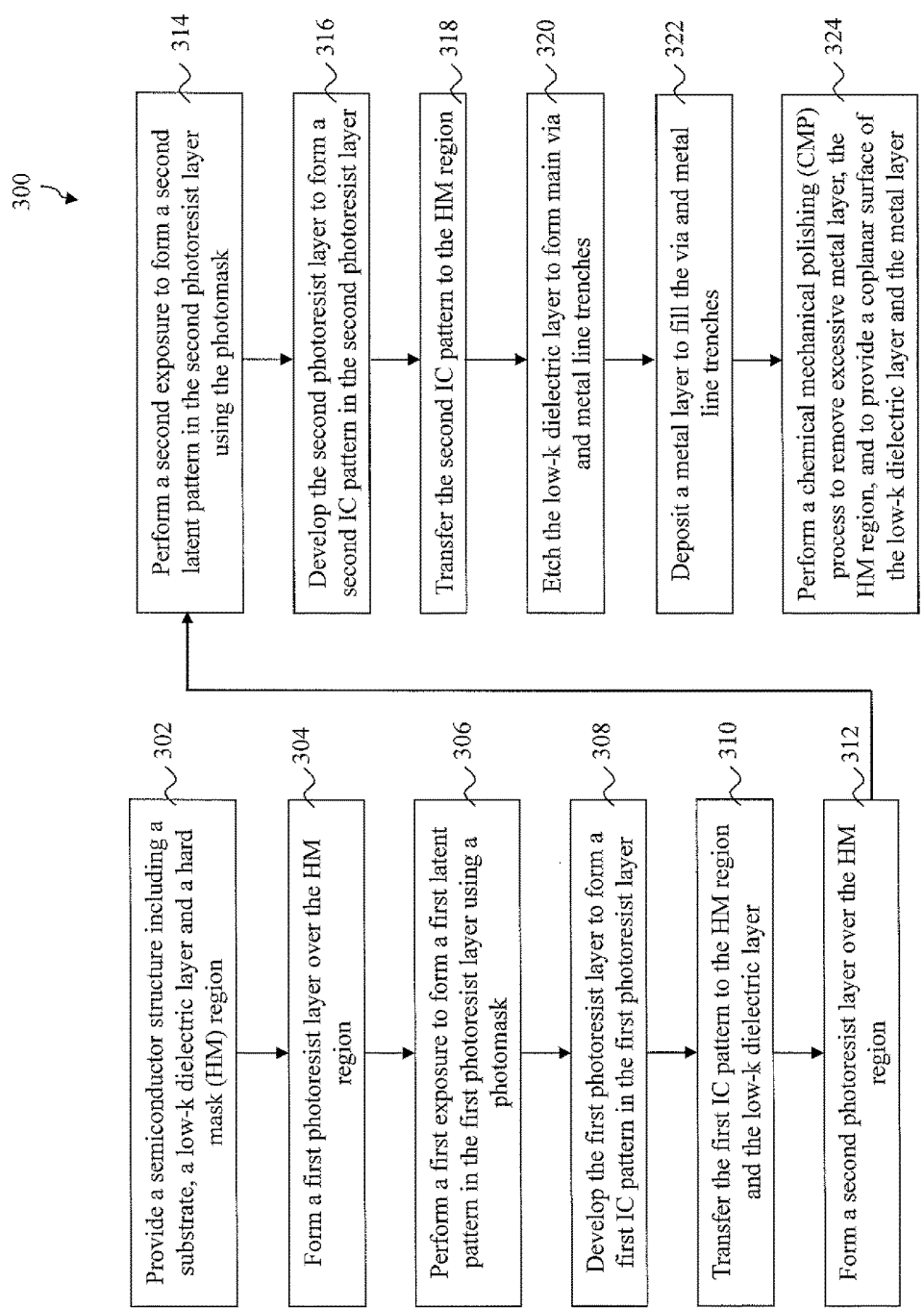
FIG. 3 is a flowchart of a method for making a semiconductor structure using the photomask of FIG. 1 according to one or more embodiments of the present disclosure.

FIG. 3 is a flowchart of a method 300 for making a semiconductor structure using the photomask 100 of FIG. 1 according to one or more embodiments of the present disclosure. FIGS. 4-12 are cross sectional views of a semiconductor structure 400 at various fabrication stages constructed using the photomask 100 of FIG. 1 according to one or more embodiments of the present disclosure. The method 300 and the semiconductor structure 400 are collectively described below with reference to FIGS. 4-12. Additional steps can be provided before, during, and after the method 300, and some of the steps described can be replaced or eliminated for additional embodiments of the method. The discussion that follows illustrates various embodiments of the semiconductor structure 400 that can be fabricated according to the method 300 of FIG. 3.

Referring to FIGS. 3 and 4A-4B, the method 300 begins at step 302 by providing a semiconductor structure 400 including a semiconductor substrate 402, a low-k dielectric layer 408, and a hard mask (HM) region 409. The semiconductor substrate 402 may include silicon (Si). Alternatively or additionally, the substrate 402 may include other elementary semiconductor such as germanium (Ge). The substrate 402 may also include a compound semiconductor such as silicon carbide, gallium arsenic, indium arsenide, and indium phosphide. The substrate 402 may include an alloy semiconductor such as silicon gennanium, silicon germanium carbide, gallium arsenic phosphide, and gallium indium phosphide. In some embodiments, the substrate 402 includes an epitaxial layer. For example, the substrate 402 may have an epitaxial layer overlying a bulk semiconductor. In some embodiments, the substrate 402 may include a semiconductor-on-insulator (SOI) structure. For example, the substrate 402 may include a buried oxide layer formed by a process such as separation by implanted oxygen or other suitable technique, such as wafer bonding and grinding.

The substrate 402 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 402 may further include other functional features such as a resistor or a capacitor formed in and on the substrate. In some embodiments, the substrate 402 may further include lateral isolation features provided to separate various devices formed in the substrate 402. The isolation features may include shallow trench isolation (STI) features to define and electrically isolate the functional features. In some examples, the isolation regions may include silicon oxide, silicon nitride, silicon oxynitride, an air gap, other suitable materials, or combinations thereof. The isolation regions may be formed by any suitable process. The various IC devices may further include other features, such as silicide disposed on S/D and gate stacks overlying channels.

The semiconductor structure 400 may also include a plurality of dielectric layers and conductive features integrated to form an interconnect structure configured to couple the various p-type and n-type doped regions and the other functional features (such as gate electrodes), resulting a functional integrated circuit. In some embodiments, the substrate 402 may include a portion of the interconnect structure and is collectively referred to as the substrate 402.

As noted above, the semiconductor structure 400 may include an interconnect structure. The interconnect structure includes a multi-layer interconnect (MLI) structure and an inter-level dielectric (ILD) integrated with the MLI structure, providing an electrical routing to couple various devices in the substrate 402 to the input/output power and signals. The interconnect structure includes various metal lines, contacts and via features (or via plugs). The metal lines provide horizontal electrical routing. The contacts provide vertical connection between the substrate 402 and metal lines while via features provide vertical connection between metal lines in different metal layers.

Referring to FIGS. 4A-4B, the semiconductor structure 400 includes a conductive feature 404. In some embodiments, the conductive feature 404 may include a metal contact, a metal via, or a metal line. In some embodiments, the conductive feature 404 may be further surrounded by a barrier layer to prevent diffusion and/or provide material adhesion. In some examples, the conductive feature 404 includes aluminum (Al), copper (Cu) or tungsten (W). The barrier layer may include titanium nitride (TiN), tantalum nitride (TaN), tungsten nitride (WN), titanium silicon nitride (TiSiN) or tantalum silicon nitride (TaSiN). The conductive feature 404 and the barrier layer may be formed by a procedure including lithography, etching and deposition. In another embodiment, the conductive feature 404 includes an electrode of a capacitor, a resistor or a portion of a resistor. Alternatively, the conductive feature 404 includes a doped region (such as a source or a drain), or a gate electrode. In another example, the conductive feature 404 includes a silicide feature disposed on respective source, drain or gate electrode. The silicide feature may be formed by a self-aligned silicide (salicide) technique.

Still referring to FIGS. 4A-4B, various material layers are formed on the substrate 402, such as an etch stop layer (ESL) 406, a low-k dielectric layer 408 (e.g., ILD layer), and a hard mask (HM) region 409 formed successively along a direction away from the substrate 402. In some embodiments, the ESL 406 is formed on the conductive feature 404. The ESL 406 may include a dielectric material similar to the dielectric material in the low-k dielectric layer 408. However, the dielectric constant of the ESL 406 may be greater than that of the low-k dielectric layer 408 deposited on the ESL 406. The dielectric material in the ESL 406 may be chosen to have a higher etching selectivity over the low-k dielectric layer 408 for proper etching process at subsequent processes to form contact trenches. For example, the ESL 406 may have a lower etching rate in comparison with the low-k dielectric layer 408 on the ESL 406 in the following etching processes. In some embodiments, the ESL 406 may be deposited using any suitable technique, such as chemical vapor deposition (CVD), physical vapor deposition (PVD), atomic layer deposition (ALD), or an epitaxial growing process. In some embodiments, the ESL 406 includes an oxide layer including carbon, oxygen, silicon, and/or other suitable materials, and combinations thereof. The ESL 406 may have a thickness in a range from about 50 Å to about 200 Å.

Still referring to the semiconductor structure 400 of FIGS. 4A-4B, the low-k dielectric layer 408 is formed on the ESL 406. The low-k dielectric layer 408 may include an interlayer dielectric (ILD) material 408 formed on the ESL 406. The low-k dielectric layer 408 may include doped silicon oxide (e.g., carbon doped silicon oxide), or any other suitable dielectric materials or combinations thereof. The thickness of the low-k dielectric layer 408 may be in a range from about 500 Å to about 2000 Å. The low-k dielectric layer 408 may be formed using a spin-on coating technique or CVD. In some embodiments, a chemical mechanical polishing (CMP) process may be used to further planarize the top surface of the low-k dielectric layer 408.

The semiconductor structure 400 also includes the hard mask (HM) region 409 formed on the low-k dielectric layer 408, as shown in FIGS. 4A-4B. The HM region 409 may include a single material layer, or a plurality of material layers. In some embodiments as shown in FIG. 4, the HM region 409 includes a lower HM layer 410 and an upper HM layer 412.

The lower HM layer 410 may include a dielectric material similar to the dielectric material of the low-k dielectric layer 408, but with a greater dielectric constant (k) than that of the low-k dielectric layer 408. In some examples, the lower HM layer 410 includes an oxide layer including carbon, oxygen, silicon, and/or other suitable materials, and combinations thereof. For example, the lower HM layer 410 includes a silicon oxide ($SiO_2$) layer. The lower HM layer 410 may be formed by a deposition process, such as a CVD process. In some embodiments, the lower HM layer 410 may have a greater hardness than the low-k dielectric layer 408. In some embodiments, the thickness of the lower HM layer 410 is in a range from about 100 Å to about 300 Å. In some embodiments, the lower HM layer 410 may have a higher polish rate than that of the low-k dielectric layer 408, so that the lower HM layer 410 can be used as a buffer layer in the following polishing processes.

The upper HM layer 412 may be formed on the lower HM layer 410. In some embodiments, the upper HM layer 412 includes titanium nitride (TiN), titanium oxide ($TiO_2$), and other suitable oxide materials, or combinations thereof. In some embodiments, the upper HM layer 412 is a metal hard mask with a greater hardness than that of the lower HM layer 410. The upper HM layer 412 may have a thickness in a range from about 100 Å to about 500 Å. In some embodiments, the upper HM layer 412 is formed using any suitable technique, such as CVD, PVD, ALD, or an epitaxial growing process. The upper HM layer 412 may be used to transfer the IC design pattern from the photomask (e.g. photomask 100 of FIG. 1) to the low-k dielectric layer 408. It is to be understood that although there are two HM layers shown in FIGS. 4A-4B, the HM region 409 may include a single HM layer 412. The HM region 409 may also include more than two material layers that can be used to transfer one or more IC design patterns from a photomask to the low-k dielectric layer.

Figure 5B:
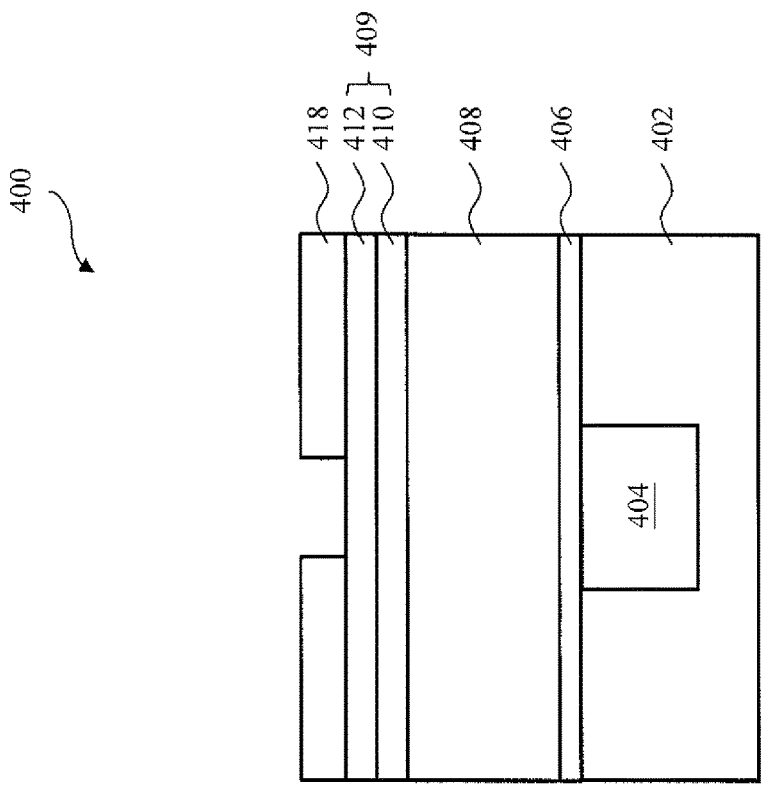
Figure 5A:
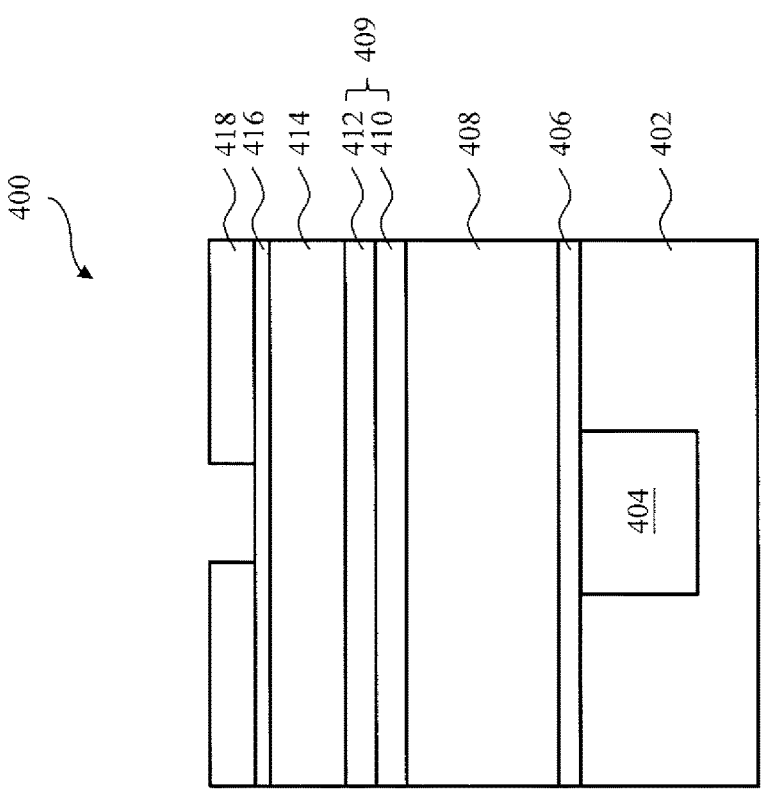

FIGS. 4A and 5A illustrate a cross sectional view of a semiconductor structure using a tri-layer structure including a first photoresist layer 417, a first middle layer 416, and a first bottom layer 414. FIGS. 4B and 5B illustrate a cross sectional view of a semiconductor structure using a single layer structure including only the first photoresist layer 417.

Referring to FIG. 4A, before forming a photoresist layer, a first bottom layer 414 is formed on the HM region 409, and a first middle layer 416 is formed on the first bottom layer 414. The first bottom layer 414 and the first middle layer 416 may be formed using any suitable coating technique, such as a spin-on coating process. Other manufacturing steps, such as baking, may further applied to the first bottom layer 414 and the first middle layer 416. In some embodiments, the first middle layer 416 includes carbon, oxygen, silicon, and/or other suitable materials, and combinations thereof. The first middle layer 416 may transfer pattern from the first photoresist layer 417 to the first bottom layer 414. In some embodiments, the first middle layer 416 has a greater hardness than the hardness of the first bottom layer 414. The first middle layer 416 may have a greater hardness than the hardness of the first photoresist layer 417. In some embodiments, the first middle layer 416 has a less thickness than the thickness of the first bottom layer 414. In some embodiments, the first middle layer 416 has a less thickness than that of the first photoresist layer 417. In some embodiments, the first middle layer 416 does not include the resist sensitizer chemicals that react photochemically in response to radiant energy in the form of light. In some embodiments, the first bottom layer 414 includes any suitable polymer materials, such as a polymer material similar to the photoresist material. In some embodiments, the first bottom layer 414 is an organic anti-reflective (ARC) material configured to suppress unintended light reflection during lithography process. In some embodiments, the first bottom layer 414 transfers pattern from the photoresist layer to the HM region 409. The first middle layer 416 has a thickness in a range from about 100 Å to about 300 Å. The first bottom layer 414 has a thickness in a range from about 500 Å to about 2000 Å. In some embodiments, the first bottom layer 414 and the first middle layer 416 are indissoluble in the developer solution used to develop and form the IC design pattern in the photoresist layer. The first bottom layer 414 and the first middle layer 416 may also improve the intrinsic adhesion between the photoresist layer and the HM region 409, so that the material integration of the semiconductor structure 400 may be improved.

Referring to FIGS. 3 and 4A-4B, method 300 proceeds to step 304 by forming a first photoresist layer 417 over the HM region 409. Forming of the first photoresist layer 417 includes coating the first photoresist solution on the first middle layer 416 (see FIG. 4A) or HM region 409 (see FIG. 4B) by a suitable technique, such as spin-on coating. Other manufacturing steps, such as baking may be further applied to the first photoresist layer 417. The first photoresist layer 417 includes an organic positive photoresist material that may become dissolvable to the developer solution after exposing to the radiation source. In some alternative embodiments, the first photoresist layer 417 may also include an organic negative photoresist material that becomes indissolvable to the developer solution after exposing to the radiation source. The composition of the first photoresist layer 417 may be adjusted, for example, by changing the ratio of carbon, hydrogen and oxygen, to have a suitable exposure threshold for the first lithography exposure process as discussed later in the present disclosure. The first photoresist layer 417 may have a thickness in a range from about 200 Å to about 800 Å.

Referring to FIGS. 3 and 4A-4B, method 300 proceeds to step 306 by performing a first lithography exposure process to form a first latent pattern in the first photoresist layer 417. The first lithography exposure may use the photomask 100 of FIG. 1 including the first IC feature 106 (e.g., a via feature) and the second IC feature 108 (e.g., a metal line feature) defined thereon. In some embodiments, the composition of the first photoresist layer 417 is adjusted so that a suitable exposure threshold can be obtained to expose only the first IC feature 106 in the first photoresist layer 417. In some embodiments, the distance between the first photoresist layer 417 and the lens 210 are adjusted to control the exposing intensity so that only the first IC feature 106 can be transferred to the first photoresist layer 417.

In a present embodiments, the first lithography exposure is performed in defocus status as illustrated in FIG. 2C, where the first photoresist layer 417 is located at a defocus position 230 as shown in FIG. 2A. During the defocus exposure, the exposure intensity of the exposing source passing through the first IC feature 106 (e.g., a via feature) of the photomask 100 is equal to or greater than the exposure threshold of the first photoresist layer 417. The exposure intensity of the exposing source passing through the second IC feature 108 (e.g., a metal line feature) of the photomask 100 is below the exposure threshold of the first photoresist layer 417. Therefore, the first latent pattern formed in the first photoresist layer 417 after the first lithography exposure includes the first IC feature 106 (e.g., a via feature) without showing the second IC feature 108 (e.g., a metal line feature).

The exposing source used in the first lithography exposure may include any suitable source such as UV, DUV, EUV, or charged particles, such as electron-beam. In some alternative embodiments, the IC design pattern is defined in a data file and is transferred to the photoresist layers by direct writing or other suitable technique, such as digital pattern generator. Other steps may be implemented before, during, or after the exposure process. In some embodiments, a post exposure baking process may be applied to the first photoresist layer 417 after the lithography exposure process.

Referring to FIGS. 3 and 5A-5B, method 300 proceeds to step 308 by developing the first photoresist layer 417 to form a first photoresist pattern 418. In some embodiments, the first photoresist layer 417 is positive, so the portions of the first photoresist layer 417 associated with the first latent pattern (e.g., IC feature 106 of the photomask 100) are removed by the corresponding developer to form the first photoresist pattern 418. Thereafter, other steps may be implemented. In some examples, one or more baking processes may be applied to the first photoresist pattern 418 after the developing process. In some embodiments as shown in FIG. 5A, the first photoresist pattern 418 may be formed on the first middle layer 416 and the first bottom layer 414. In some embodiments as shown in FIG. 5B, the first photoresist pattern 418 may be formed on the HM region 409.

Figure 6:
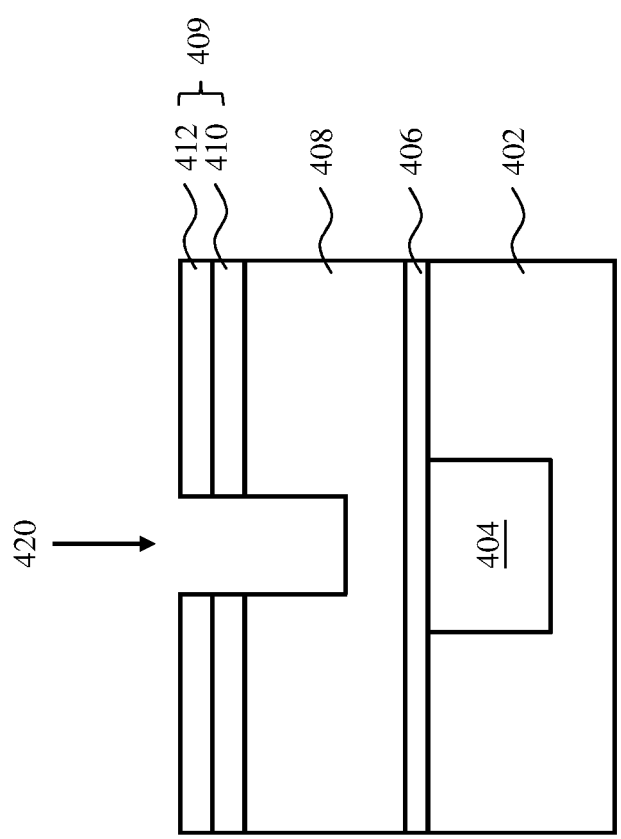

Referring to FIGS. 3 and 6, method 300 proceeds to step 310 by transferring the first IC feature 106 (e.g., via feature) to the HM region 409 and the low-k dielectric layer 408. Step 310 may include one or more etching processes to remove the portions of the HM region 409 and the low-k dielectric layer 408 aligned with the IC feature 106 of the photomask 100 to form a via trench 420. The etching process may include any suitable etching technique, such as dry etching, wet etching, or a combination thereof. In some embodiments, the etching process at step 310 stops within the low-k dielectric layer 408, before the low-k dielectric layer 408 is etched through as shown in FIG. 6. Other operations may be subsequently implemented. For example, the first photoresist patter 418, the first middle layer 416, and the first bottom layer 414 are removed by wet stripping or plasma ashing process. The plasma ashing process may include using oxygen ($O_2$) plasma or carbon dioxide ($CO_2$) plasma.

Figure 7B:
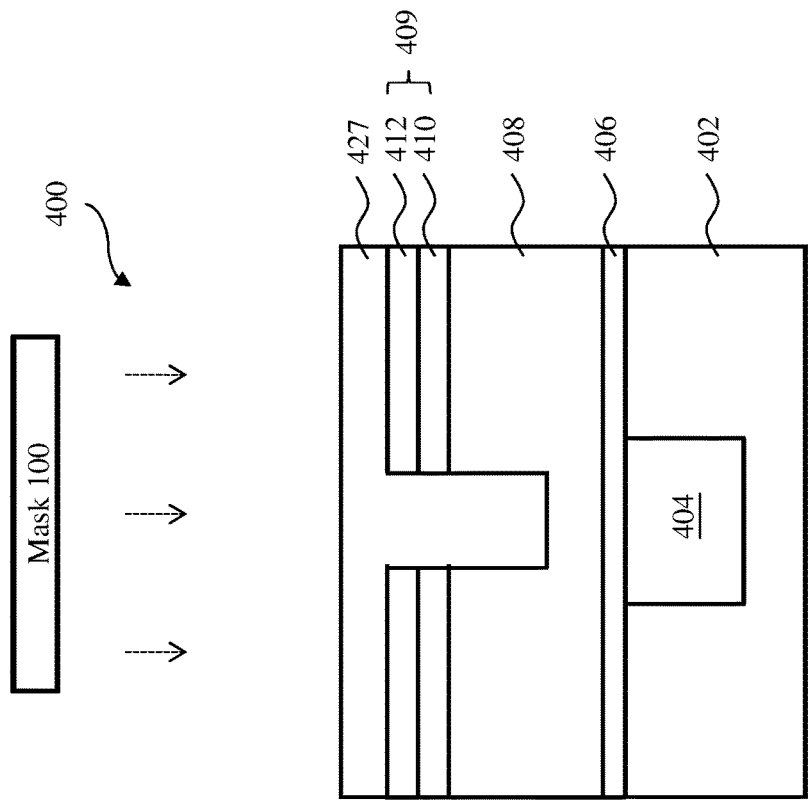
Figure 7A:
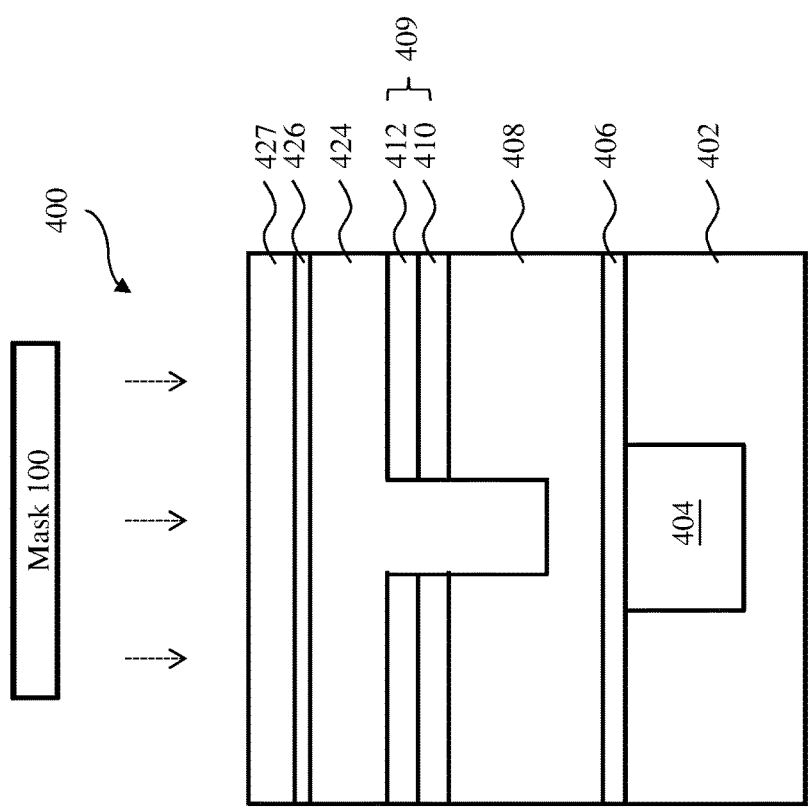
Figure 8A:
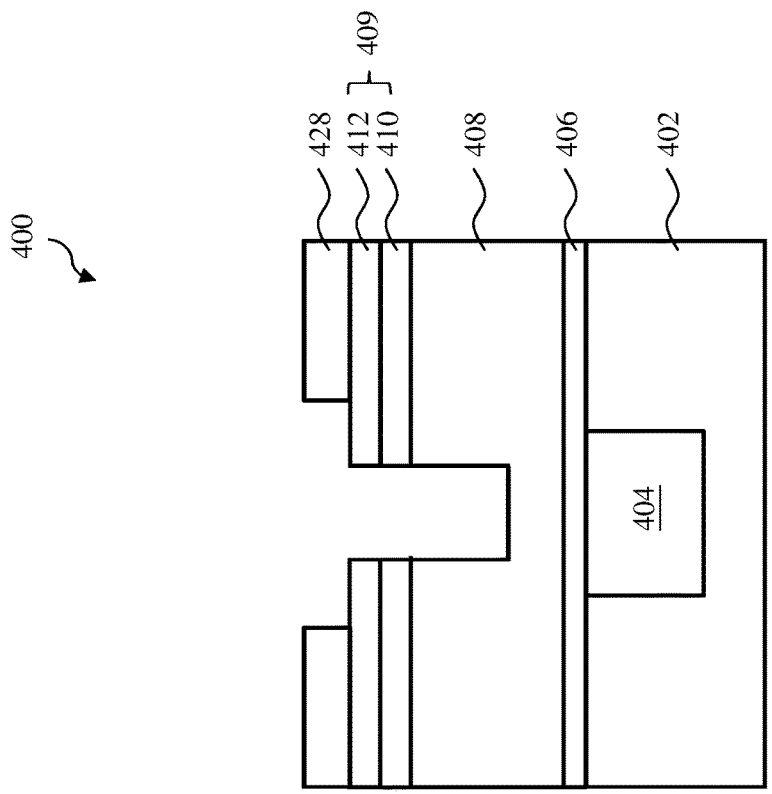
Figure 8B:
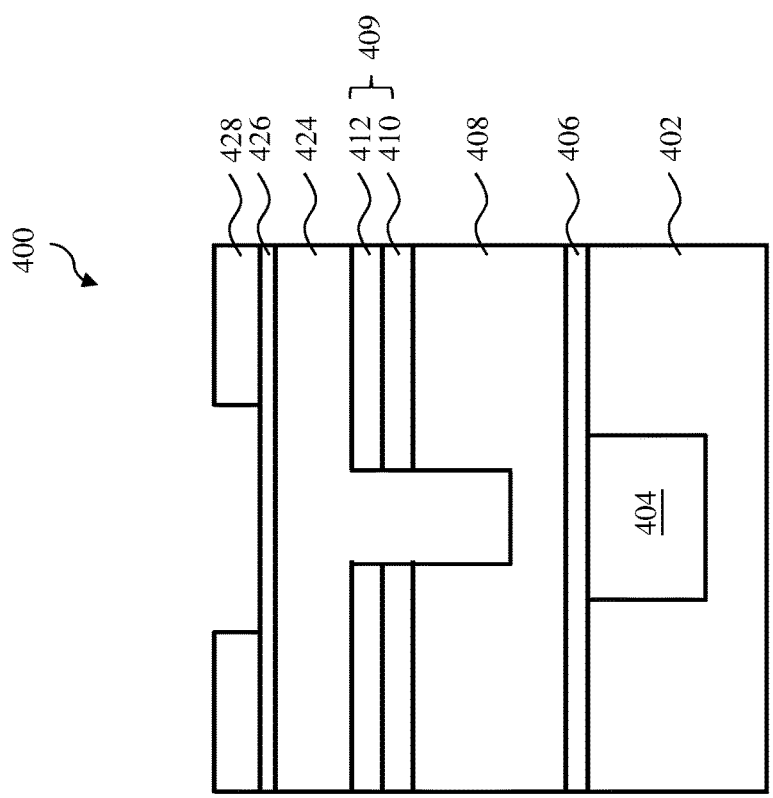

FIGS. 7A and 8A illustrate a cross sectional view of the semiconductor structure using a tri-layer structure including a second photoresist layer 427, a second middle layer 426, and a second bottom layer 424. FIGS. 7B and 8B illustrate a cross sectional view of a semiconductor structure using a single layer structure including only the second photoresist layer 427.

Referring to FIG. 7A, before forming a second photoresist layer, a second bottom layer 424 is formed on the HM region 409, and a second middle layer 426 is formed on the second bottom layer 424. The second bottom layer 424 and the second middle layer 426 may be formed using any suitable coating technique, such as spin-on coating. Other manufacturing steps, such as baking, may further applied to the second bottom layer 424 and the second middle layer 426. In some embodiments, the formation process, the composition of the material, and the thickness of the second bottom layer 424 and the second middle layer 426 are substantially similar to that of the first bottom layer 414 and the first middle layer 416. In some embodiments, the second middle layer 426 includes an organic anti-reflective material configured to suppress unintended light reflection during lithography process.

In some embodiments, the second bottom layer 424 and the second middle layer 426 of FIG. 7A are not sensitive to the radiation source during exposure process. The second bottom layer 424 and the second middle layer 426 are also indissoluble in the developer solution used to form the IC design pattern in the second photoresist layer. The second bottom layer 424 may improve the filling of the via trench 420. The second bottom layer 424 and the second middle layer 426 may also improve the intrinsic adhesion between the second photoresist layer and the HM region 409, so that the material integration of the semiconductor structure 400 may be improved.

Referring to FIGS. 3 and 7A-7B, method 300 proceeds to step 312 by forming a second photoresist layer 427 over the HM region 409. The second photoresist layer 427 may be formed on the second middle layer 426 as shown in FIG. 7A. Alternatively, the second photoresist layer 427 may be formed on the HM region 409 as shown in FIG. 7B. The formation process of the second photoresist layer 427 may be substantially similar to that of the first photoresist layer 417 as discussed with respect to step 304. The second photoresist layer 427 includes an organic positive photoresist material that may become dissolvable to the developer solution after exposing to the radiation source. In some alternative embodiments, the second photoresist layer 427 also includes an organic negative photoresist material that becomes indissolvable to the developer solution after exposing to the radiation source. The composition of the second photoresist layer 427 may be adjusted, for example, by changing the ratio of carbon, hydrogen and oxygen, to have a suitable exposure threshold for the second lithography exposure process as discussed later in the present disclosure. The second photoresist layer 427 may have a thickness in a range from about 200 Å to about 800 Å.

Referring to FIGS. 3 and 7A-7B, method 300 proceeds to step 314 by performing a second lithography exposure process to form a second latent pattern in the second photoresist layer 427. As shown in FIGS. 7A-7B, the second lithography exposure uses the same photomask 100 of FIG. 1 as that of the first lithography exposure of step 306. The second lithography exposure may be performed in on-focus status as illustrated in FIG. 2B, where the second photoresist layer 427 is located on the focal plane 220 of the lens 210 as shown in FIG. 2A. During the on-focus exposure, the exposure intensity of the exposing source passing through both the first IC feature 106 (e.g., via feature) and the second IC feature 108 (e.g., metal line feature) of the photomask 100 is equal to or greater than the exposure threshold of the second photoresist layer 427. Therefore, the second latent pattern formed in the second photoresist layer 427 includes both the first IC feature 106 (e.g., via feature) and the second IC feature (e.g., metal line feature). In some embodiments, the composition of the second photoresist layer 427 may also be adjusted so that a suitable exposure threshold can be obtained for exposing both the first IC feature 106 and the second IC feature 108 in the second photoresist layer 427. The exposing source used in the second lithography exposure may be substantially similar to that of the first lithography exposure. Other steps may be implemented before, during, or after the exposure process, such as a post exposure baking process.

Referring to FIGS. 3 and 8A-8B, method 300 proceeds to step 316 by developing the second photoresist layer 427 to form a second photoresist pattern 428. The developing process at step 316 may be substantially similar to the developing process at step 308. In some embodiments as shown in FIG. 8A, the second photoresist pattern 428 is formed on the second middle layer 426 and the second bottom layer 424. In some embodiments as shown in FIG. 8B, the second photoresist pattern 428 is formed on the HM region 409.

Figure 9:
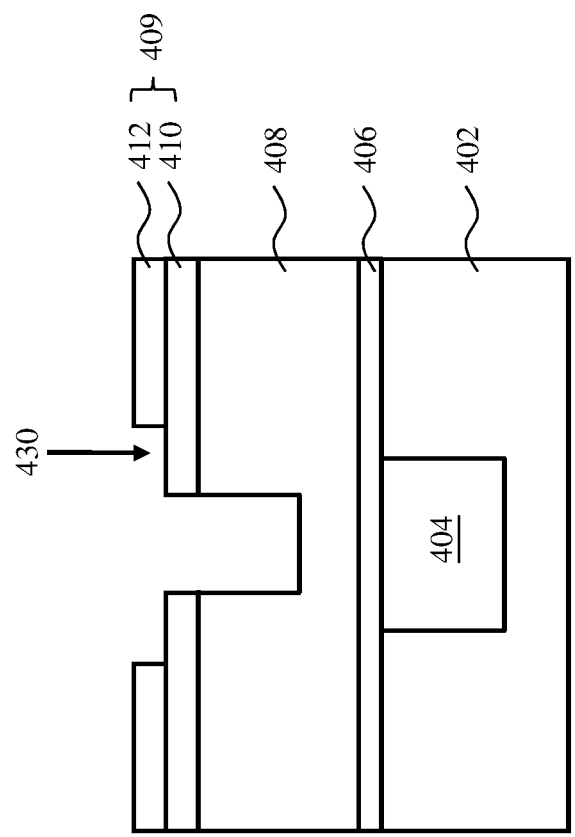

Referring to FIGS. 3 and 9, method 300 proceeds to step 318 by transferring the first IC feature 106 (e.g., via feature) and the second IC feature 108 (e.g., metal line feature) to the upper HM layer 412 of the HM region 409. Step 318 may include one or more etching processes to remove the portions of the upper HM material 412 aligned with the first IC feature 106 and the second IC feature 108 of the photomask 100 to form a HM trench 430. The HM trench 430 may include a metal line trench. In some embodiments, the etching process at step 318 includes a dry etching process using chlorine gas ($Cl_2$) and/or methane gas ($CH_4$). Because the etching selectivity of the lower HM layer 410 is higher over that of the upper HM layer 412, or the etching rate of the lower HM layer 410 is lower than that of the upper HM layer 412, the etching process at step 318 stops at the lower HM layer 410 as shown in FIG. 9. Other operations may be subsequently implemented. For example, the second photoresist patter 428, the second middle layer 426, and the second bottom layer 424 may be removed by wet stripping or plasma ashing process. The plasma ashing process may include using oxygen ($O_2$) plasma or carbon dioxide ($CO_2$) plasma.

Figure 10:
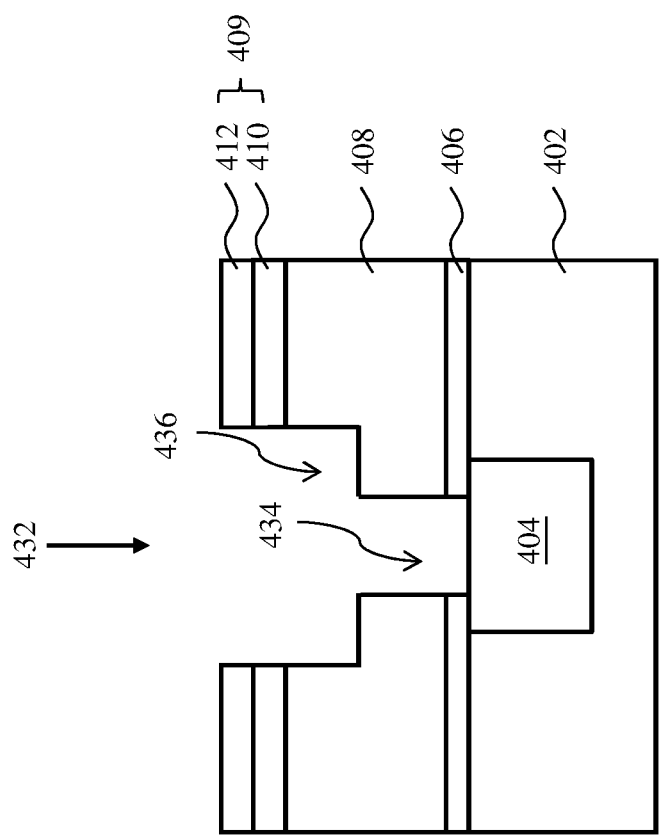

Referring to FIGS. 3 and 10, method 300 proceeds to step 320 by selectively etching the lower HM layer 410 and the low-k dielectric layer 408 using the upper HM layer 412 and the lower HM layer 410 of FIG. 9 as an etch mask, thereby forming the main trench 432. The main trench 432 includes a via trench 434 and a metal line trench 436 in the low-k dielectric layer 408. The etch process at step 320 may include any suitable etching technique, such as dry etching, wet etching, or a combination thereof. In some embodiments, the step 320 includes more than one substep. In the first substep, the via trench 434 in the low-k dielectric layer 408 is etched to stop at the ESL 406 in the first substep. After the via trench 434 and the metal line trench 436 have been formed in the low-k dielectric layer 408, in the second substep, the ESL 406 is then opened by another etch for proper electrical connection to the conductive feature 404. In some embodiments, a barrier layer is formed along the wall of the main trench 432 before depositing the metal layer to fill the main trench 432 in the following steps.

Figure 11:
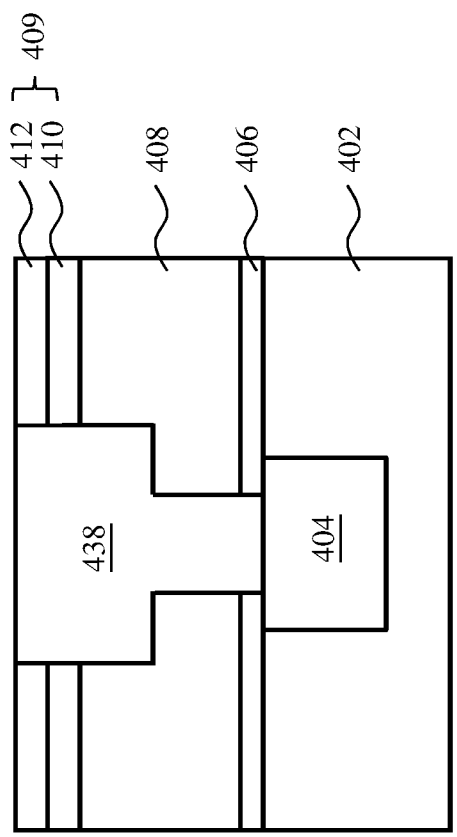

Referring to FIGS. 3 and 11, method 300 proceeds to step 322 by depositing a metal layer 438 to fill the main trench 432. In some embodiments, the metal layer 438 includes copper (Cu), aluminum (Al), tungsten (W) or other suitable conductive material. In some embodiments, the metal layer 432 includes Cu alloy, such as copper magnesium (CuMn), copper aluminum (CuAl) or copper silicon (CuSi). In some embodiments, the metal layer 432 is deposited by PVD. In some examples, the metal layer 432 is formed by depositing a corresponding metal seed layer using PVD, and then forming a bulk metal layer by plating.

Figure 12:
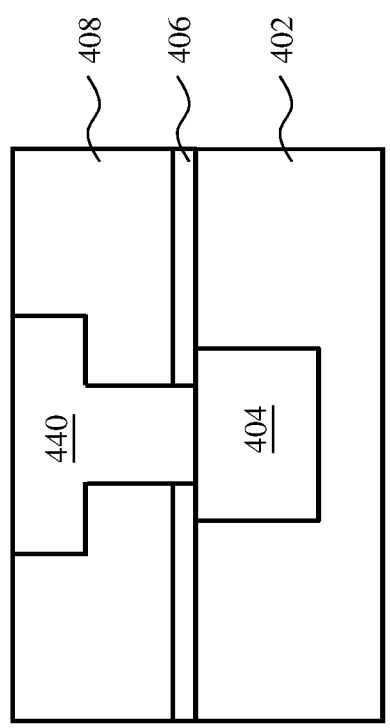

Referring to FIGS. 3 and 12, method 300 proceeds to step 324 by performing a chemical mechanical polishing (CMP) process to remove the excessive metal layer 432. The CMP process at step 324 may also remove the HM region 409. A substantially coplanar top surface of the metal layer 432 and the low-k dielectric layer 408 may be formed after the CMP process.

The present disclosure provides a method for forming an integrated circuit (IC) structure. The method comprises providing a semiconductor structure including a substrate, a dielectric layer formed over the substrate, and a hard mask region formed over the dielectric layer; forming a first photoresist layer over the hard mask region; performing a first lithography exposure using a photomask to form a first latent pattern; forming a second photoresist layer over the hard mask region; and performing a second lithography exposure using the photomask to form a second latent pattern. The photomask includes a first mask feature and a second mask feature. The first latent pattern corresponds to the first mask feature, and the second latent pattern corresponds to the first mask feature and the second mask feature.

In some embodiments, the hard mask region includes a first hard mask layer formed on the dielectric layer, and a second hard mask layer formed on the first hard mask layer.

In some embodiments, after performing the first lithography exposure, the method further includes developing the first photoresist layer to form a first IC feature from the first latent pattern; and transferring the first IC feature to the first hard mask layer, the second hard mask layer, and the dielectric layer.

In some embodiments, after performing the second lithography exposure, the method further includes developing the second photoresist layer to form a second IC feature from the second latent pattern; and transferring the second IC feature to the second hard mask layer.

In some embodiments, after transferring the second IC feature to the second hard mask layer, the method further includes etching the dielectric layer using the first hard mask layer and the second hard mask layer to form a trench corresponding to the first IC feature and the second IC feature in the dielectric layer.

In some embodiments, the method further includes depositing a metal layer to fill the trench in the dielectric layer; and performing a chemical mechanical polishing process to form a coplanar surface of the dielectric layer and the metal layer.

In some embodiments, before forming the first photoresist layer, the method further includes forming a first bottom layer on the hard mask region; and forming a first middle layer on the first bottom layer. The first bottom layer and the first middle layer are indissoluble in a developer used for developing the first photoresist layer. The first IC feature is transferred to the first bottom layer and the first middle layer.

In some embodiments, before forming the second photoresist layer, the method further includes forming a second bottom layer on the hard mask region; and forming a second middle layer on the second bottom layer. The second bottom layer and the second middle layer are indissoluble in a developer used for developing the second photoresist layer. The second IC feature is transferred to the second bottom layer and the second middle layer.

In some embodiments, the first mask feature aligns along a first direction. The second mask feature aligns along a second direction that is different from the first direction. The first mask feature intersects with the second mask feature. The first mask feature has a greater dimension than that of the second mask feature along the first dimension. The first mask feature includes a via feature, and the second mask feature includes a metal line feature.

In some embodiments, performing the first lithography exposure includes performing the first lithography exposure at a defocus condition. Performing the second lithography exposure includes performing the second lithography exposure at an on-focus condition.

In some embodiments, semiconductor structure further includes an etch stop layer (ESL) formed between the substrate and the dielectric layer. After etching the dielectric layer, the method further includes etching the ESL using the first hard mask layer and the second hard mask layer.

The present disclosure also provides a method for forming an integrated circuit (IC) structure. The method comprises providing a substrate, a dielectric layer formed over the substrate, and a first hard mask layer formed over the dielectric layer; providing a photomask including a first mask feature and a second mask feature, the first mask feature having a greater dimension than that of the second mask feature; forming a first photoresist layer over the first hard mask layer, the first photoresist layer having a first exposure threshold; performing a first exposure using the photomask to form a first IC feature corresponding to the first mask feature; transferring the first IC feature to the first hard mask layer and the dielectric layer; forming a second photoresist layer over the first hard mask, the second photoresist layer having a second exposure threshold; performing a second exposure using the photomask to form a second IC feature corresponding to the first and second mask features; transferring the second IC feature to the first hard mask layer; and etching the dielectric layer using the first hard mask layer to form a trench corresponding to the first IC feature and the second IC feature in the dielectric layer. A first exposing intensity of the second mask feature during the first lithography exposure is less than the first exposure threshold. A second exposing intensity of the second mask feature during the second lithography exposure is greater than the second exposure threshold.

In some embodiments, performing the first exposure includes performing the first exposure at a defocus condition. Performing the second exposure includes performing the second exposure at an on-focus condition.

In some embodiments, the method further comprises providing a second hard mask layer between the first hard mask layer and the dielectric layer. The first IC feature is transferred to both the first hard mask layer and the second hard mask layer.

The present disclosure also provides yet another embodiment of a method for lithography. The method includes providing a photomask including a first mask feature and a second mask feature; performing a first exposure at a defocus condition to a first photoresist layer coated on a semiconductor substrate using the photomask to form a first latent pattern, the first latent pattern corresponding to the first mask feature; and performing a second exposure at an on-focus condition to a second photoresist layer coated on the semiconductor substrate using the photomask to form a second latent pattern, the second latent pattern corresponding to the first and second mask features. In some embodiments, the first mask feature has a greater dimension than that of the second mask feature along a direction. In some embodiments, a first exposing intensity through the second mask feature during the first exposure is less than an exposure threshold of the first photoresist layer. A second exposing intensity through the second mask feature during the second exposure is greater than an exposure threshold of the second photoresist layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated circuit (IC) structure, comprising:
providing a semiconductor structure including a substrate, a dielectric layer formed over the substrate, and a hard mask region formed over the dielectric layer;
forming a first photoresist layer over the hard mask region;
performing a first lithography exposure using a photomask to form a first resist pattern in the first photoresist layer, wherein the photomask includes a first mask feature and a second mask feature, and the first resist pattern is formed from the first mask feature;
transferring the first resist pattern to the hard mask region, thereby forming a first trench;
forming a second photoresist layer over the hard mask region; and
performing a second lithography exposure using the photomask to form a second resist pattern, wherein the second resist pattern is formed from both the first mask feature and the second mask feature and overlaps the first trench from a top view.

2. The method of claim 1, wherein the hard mask region includes a first hard mask layer formed on the dielectric layer, and a second hard mask layer formed on the first hard mask layer.

3. The method of claim 2,
wherein the transferring of the first resist pattern to the hard mask region includes etching the first hard mask layer, the second hard mask layer, and the dielectric layer.

4. The method of claim 3, after performing the second lithography exposure, further comprising:
transferring the second resist pattern to the second hard mask layer.

5. The method of claim 4, after transferring the second resist pattern to the second hard mask layer, further comprising:
etching the dielectric layer using the first hard mask layer and the second hard mask layer to form a via trench and a line trench in the dielectric layer.

6. The method of claim 5, further comprising:
depositing a metal layer to fill the via trench and the line trench in the dielectric layer; and
performing a chemical mechanical polishing (CMP) process to form a coplanar surface of the dielectric layer and the metal layer.

7. The method of claim 3, before forming the first photoresist layer, further comprising:
forming a first bottom layer on the hard mask region; and
forming a first middle layer on the first bottom layer,
wherein the first bottom layer and the first middle layer are indissoluble in a developer used for developing the first photoresist layer.

8. The method of claim 4, before forming the second photoresist layer, further comprising:
forming a second bottom layer on the hard mask region; and
forming a second middle layer on the second bottom layer,
wherein the second bottom layer and the second middle layer are indissoluble in a developer used for developing the second photoresist layer.

9. The method of claim 1, wherein the first mask feature aligns along a first direction, and
wherein the second mask feature aligns along a second direction that is different from the first direction, the first mask feature intersecting with the second mask feature.

10. The method of claim 9, wherein the first mask feature has a greater dimension than that of the second mask feature along the first direction.

11. The method of claim 10, wherein the first mask feature includes a via feature, and the second mask feature includes a metal line feature.

12. The method of claim 1, wherein performing the first lithography exposure includes performing the first lithography exposure at a defocus condition, and
wherein performing the second lithography exposure includes performing the second lithography exposure at an on-focus condition.

13. The method of claim 5, wherein the semiconductor structure further includes an etch stop layer (ESL) formed between the substrate and the dielectric layer.

14. The method of claim 13, after etching the dielectric layer, further comprising:
etching the ESL using the first hard mask layer and the second hard mask layer.

15. A method for forming a semiconductor structure, comprising:
providing a substrate, a dielectric layer formed over the substrate, and a first hard mask layer formed over the dielectric layer;
providing a photomask including a first mask feature and a second mask feature, the first mask feature having a greater dimension than that of the second mask feature;
forming a first photoresist layer over the first hard mask layer, the first photoresist layer having a first exposure threshold;
performing a first exposure using the photomask to form a first resist pattern corresponding to the first mask feature;
transferring the first resist pattern to the first hard mask layer and the dielectric layer;
forming a second photoresist layer over the first hard mask layer, the second photoresist layer having a second exposure threshold;
performing a second exposure using the photomask to form a second resist pattern corresponding to the first and second mask features;
transferring the second resist pattern to the first hard mask layer; and
etching the dielectric layer using the first hard mask layer to form a trench corresponding to the first resist pattern and the second resist pattern in the dielectric layer,
wherein a first exposing intensity of the second mask feature during the first exposure is less than the first exposure threshold, and
wherein a second exposing intensity of the second mask feature during the second exposure is greater than the second exposure threshold.

16. The method of claim 15, wherein performing the first exposure includes performing the first exposure at a defocus condition, and
wherein performing the second exposure includes performing the second exposure at an on-focus condition.

17. The method of claim 15, further comprising providing a second hard mask layer between the first hard mask layer and the dielectric layer, the first resist pattern being transferred to both the first hard mask layer and the second hard mask layer.

18. A method for lithography, comprising:
providing a photomask including a first mask feature and a second mask feature;
performing a first exposure at a defocus condition to a first photoresist layer coated on a semiconductor structure using the photomask to form a first resist pattern, the first resist pattern corresponding to the first mask feature;
transferring the first resist pattern to a hard mask region of the semiconductor structure, thereby forming a first hard mask pattern; and
performing a second exposure at an on-focus condition to a second photoresist layer coated on the semiconductor structure using the photomask to form a second resist pattern, the second resist pattern corresponding to the first and second mask features and overlapping the first hard mask pattern from a top view.

19. The method of claim 18, wherein the first mask feature has a greater dimension than that of the second mask feature along a direction.

20. The method of claim 19, wherein a first exposing intensity through the second mask feature during the first exposure is less than an exposure threshold of the first photoresist layer, and wherein a second exposing intensity through the second mask feature during the second exposure is greater than an exposure threshold of the second photoresist layer.

* * * * *